United States Patent [19]

Yoshida et al.

[11] Patent Number: 5,051,574

[45] Date of Patent: Sep. 24, 1991

[54] OPTICAL COORDINATE DETECTION APPARATUS

[75] Inventors: Shigeo Yoshida; Isamu Fujimoto, both of Chiba, Japan

[73] Assignee: Dowa Mining Co., Ltd., Tokyo, Japan

[21] Appl. No.: 545,559

[22] Filed: Jun. 29, 1990

[30] Foreign Application Priority Data

Jun. 30, 1989 [JP] Japan .................................. 1-168570

[51] Int. Cl.$^5$ ................................................. G01V 9/04
[52] U.S. Cl. ...................................... 250/221; 250/205; 340/712
[58] Field of Search ................. 250/221, 205; 340/712, 340/555-557; 341/31

[56] References Cited

U.S. PATENT DOCUMENTS 3,775,560 11/1973 Ebeling et al. .
3,860,754 1/1975 Johnson et al. .
4,710,759 12/1987 Fitzgibbon ........................... 340/712
4,813,642 3/1989 Hasegawa et al. ................... 250/205
4,904,857 2/1990 Ando et al. .......................... 250/221

Primary Examiner—David C. Nelms
Assistant Examiner—Khaled Shami
Attorney, Agent, or Firm—Cushman, Darby & Cushman

[57] ABSTRACT

The present optical detection apparatus is adapted to measure an individual light reception value received by respective photodetectors when the light is interrupted by an object and the driving amount for light emission of the respective light emitting devices is controlled to be equal, compute and store the individual driving amount for light emission of the respective light emitting devices so that the individual light reception value may be kept constant and drive the respective light emitting devices in accordance with the individual driving amount for light emission. Accordingly, variation of the light reception value of the respective photodetectors may be eliminated thus preventing erroneous detection of an object.

6 Claims, 2 Drawing Sheets

OPTICAL COORDINATE DETECTION APPARATUS

BACKGROUND OF THE INVENTION

The present invention relates to an optical detection apparatus adapted to optically detect an object.

DESCRIPTION OF THE PRIOR ART

As shown in FIG. 1 (prior art), there is known an optical detection apparatus in which a plurality of pairs of light emitting devices 1 and photodetectors 2 are disposed to constitute a detection panel, each pair of the light emitting device and the photodetector being spaced with a given distance therebetween and each pair of the elements are caused to sequentially operate to detect the position of an object 3 on the panel.

In the plurality of light emitting device 1 and photodetectors 2, there are variations in each element due to the difference in inherent characteristics such as light emitting intensity, light reception sensitivity, directional characteristic and the like. Furthermore, nonuniformity also occurs due to the mounting arrangement of the light emitting devices 1 and the photodetectors. When the light emitting devices are operated to emit light, and the emitted light is not interrupted by an object this results in a wide variation in the light value received by the corresponding respective photodetectors.

FIG. 2 illustrates a variation in the light normally received by the respective photodetectors $1_1$, $1_2$, $1_3$, $1_4$, $1_5$, $1_6$ and $1_7$, when the light is not interrupted by an object. The variation is caused by the various reasons as cited above when the light is not interrupted by an object. It is therefore difficult to properly decide the reference value for comparison (designated by the dotted line in FIG. 2) which serves as a base for deciding whether the light was interrupted by an object, and consequently this results in erroneous detection. FIG. 3 illustrates an example of the method of deciding the comparison level for the value of the light reception. For example, the ideal light reception value when the light is not interrupted by an object is decided to be H and the comparison level is decided between the range from the standard level "a" 40% lower than the upper limit and the standard level "b" 10% above the lower limit of the light reception value H. However, due to the occurrence of the variation in the light reception value as shown in FIG. 2, there exists such pairs of light emitting devices and photodetectors which may not receive a light value greater than the standard "a" when the light is not interrupted and may receive a light value lower than the standard "b" when the light is interrupted. In this case, the elements were replaced. Furthermore, deterioration of the elements, and reduction of the light reception value due to a time lapse also caused variations in the light reception value to be further increased, making it difficult to distinguish the variation in the light reception value from that due to the degradation of the characteristics of the elements themselves.

Accordingly an object of the present invention is to provide an optical detection apparatus adapted to prevent any erroneous detection of an object by eliminating the variation in the light reception value detected by the respective photodetectors.

SUMMARY OF THE INVENTION

The optical detection apparatus according to the present invention comprises a light emitting drive means adapted to drive the respective light emitting devices to emit light, a measuring means for detecting the individual light reception value detected by the respective photodetectors in the case that the respective light emitting devices emit an equal amount of light and the light is not interrupted by an object, a computing means for computing the individual driving amount for light emission of the respective light emitting devices in accordance with the individual light reception value measured by the measuring means so that the individual light reception value received by the respective photodetectors may be kept constant, a memory means for storing the individual driving amount for light emission for each light emitting device computed by the computing means and a control means for driving the respective light emitting devices in accordance with the amount of individual driving amount for light emission computed as above.

According to the present invention since the individual light reception value registered by the respective photodetectors when the light is not interrupted by an object and the respective light emitting devices provide an equal amount of light which is measured, variation in the individual light reception value may be detected before the presence of an object is detected. The individual driving amount of light emitted by the respective light emitting devices is computed in accordance with the detected individual light reception value and stored, and control is used to compensate for the variation of the respective light reception value in accordance with the individual driving amount of light emitted so that in the case that the light is not interrupted by an object the respective light reception value may be kept constant. Furthermore, since the variation in the light reception value due to variation in the characteristics of the elements in themselves may also be compensated, a considerable reduction in light reception value due to dirt, dust and the like adhering to the surfaces of the elements may be detected so that relative countermeasures may be taken.

DETAILED DESCRIPTION OF THE INVENTION

Figure 1:
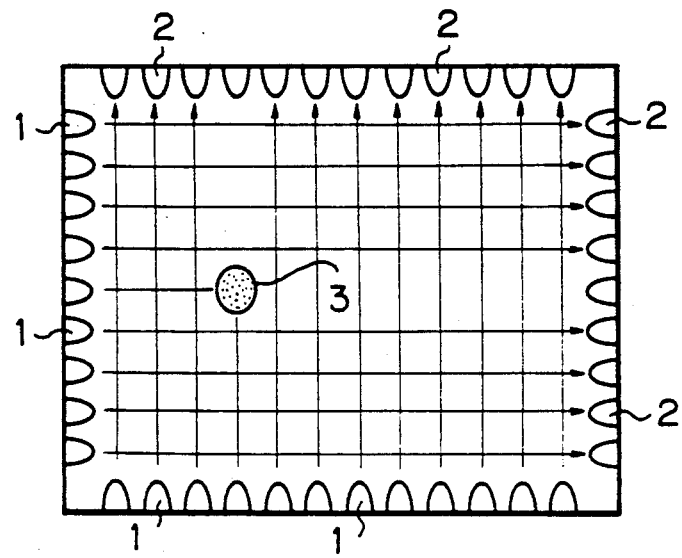
FIG. 1 (prior art) illustrates the arrangement of the light emitting devices and the photodetectors.
Figure 2:
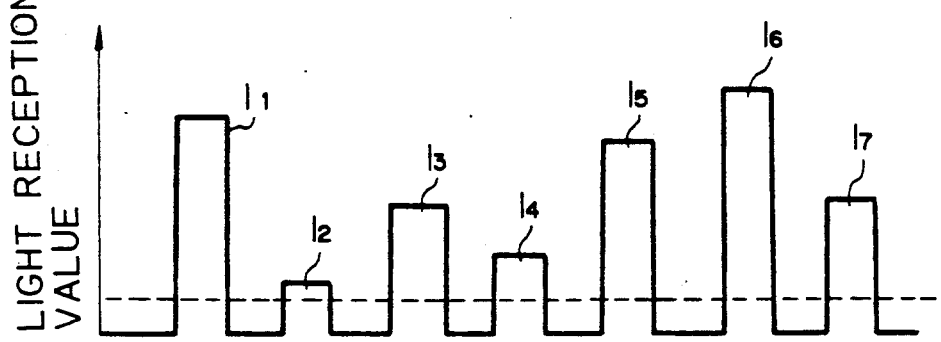
FIG. 2 prior art illustrates variation of the light reception value by the respective photodetectors according to a prior art apparatus.
Figure 3:
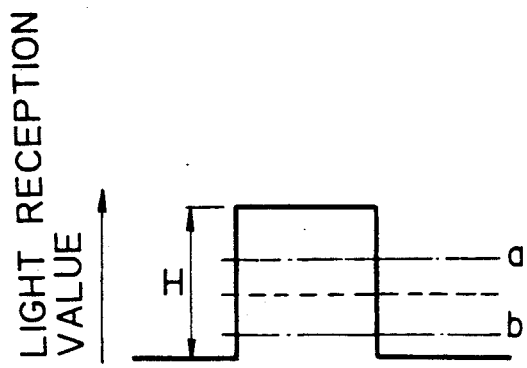
FIG. 3 illustrates the manner of deciding the comparison level serving as the reference for comparing the light reception value.
Figure 4:
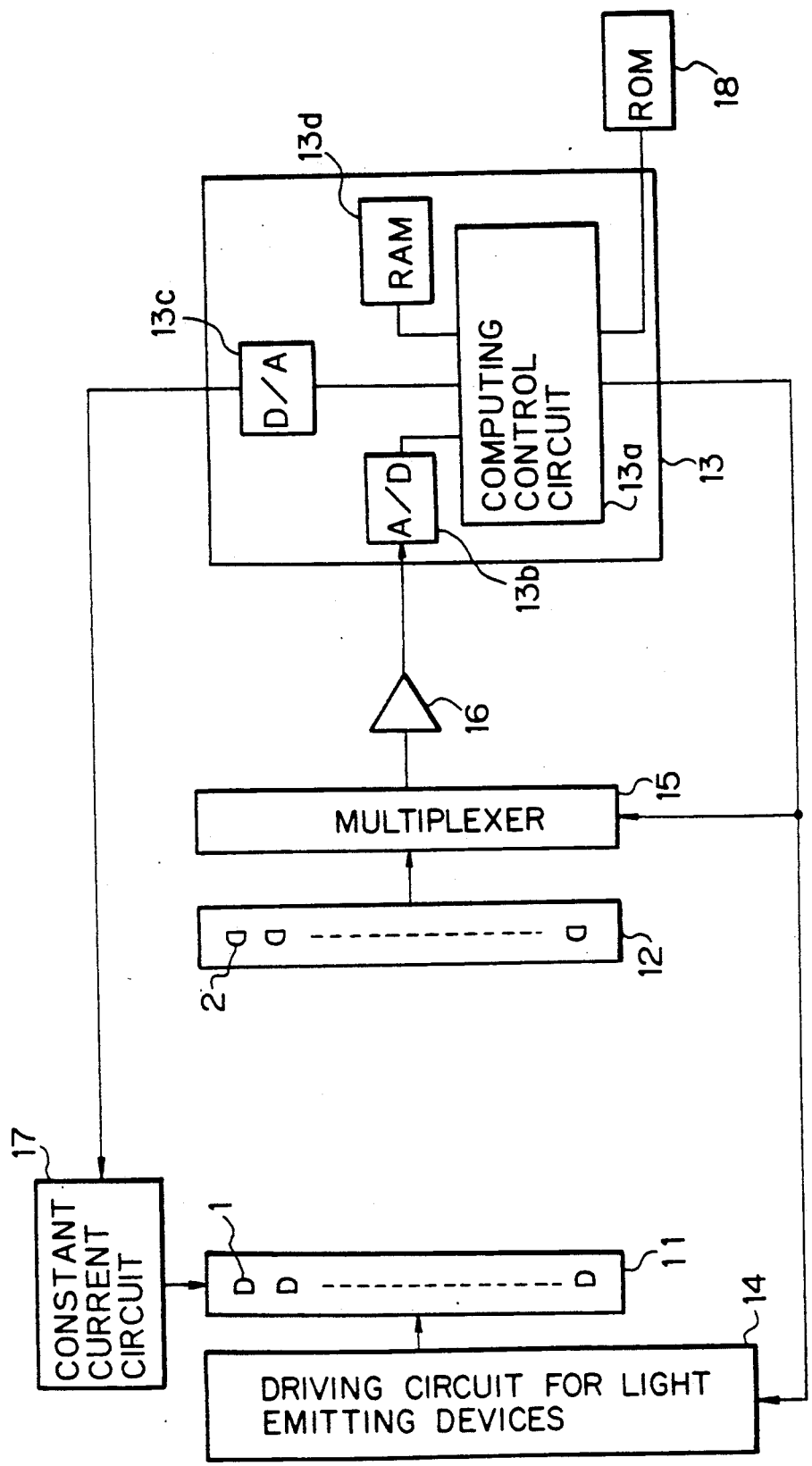
FIG. 4 illustrates the constitution of the system, showing an embodiment of the optical detection apparatus according to the present invention.

FIG. 4 illustrates an embodiment of the present invention. In the drawing, numeral 11 designates an array of light emitting devices with a plurality of light emitting devices 1 arranged therein. An array 12 of the photodetectors are spaced apart from the array 11 of the light emitting devices with a specified distance therebetween, wherein photodetectors 2 are oppositely arranged in relation to the respective light emitting devices 1, each photodetector being paired with a light emitting device. The computing control circuit 13a provided in the microprocessor 13 is adapted to sequentially scan the drive circuit 14 for the light emitting devices and the multiplexer 15 to enable respective pairs of the light emitting devices and the photodetectors 2 to be operable. The signals representing the light reception value obtained from the photodetectors 2 in an operable condition via the multiplexer 15 are input to the analog/digital converter 13b provided in the microprocessor 13 via the amplifier 10. The digital/analog converter 13c is also provided in the microprocessor 13. The D/A converter 13c converts the digital control signals sent from the computing control circuit 13a into analog control signals and outputs the analog control signals to the constant current circuit 17. The constant current circuit 17 is adapted to send the current output for light emission driving in accordance with the analog control signals to the light emitting devices 1 and to drive the light emitting devices for light emission.

The microprocessor 13 is also provided with a RAM (random access memory) 13d. RAM 13d is adapted to store the data indicating the individual light reception value of the respective light receiving devices as measured by the analog/digital converter 13b in accordance with a command by the computing control circuit 13a. The computing control circuit 13a implements a necessary computation based on the data stored as above and searches the control data necessary for controlling the light emission of the light emitting devices. The control data is also stored in the RAM 13d. ROM (read only memory) 18 is adapted to store the control data as computed above so that the data is not erased during a power failure.

Operation of the optical detection apparatus constituted as explained above will now be explained. Before an object is detected, signals to drive the light emitting devices 1 by a constant amount are output to the constant current circuit 17 via the digital/analog converter 13c from the computing control circuit 13a of the microprocessor 13 when the light is not interrupted by the object. The constant current circuit 17 then drives the respective light emitting devices 1 by a constant driving current I, whereby the individual light reception value for each corresponding photodetectors 2 is transmitted via the multiplexer 15, the amplifier 16 and the analog/digital converter 13b and is then stored sequentially in RAM 13d.

It is to be noted here that the individual light reception value provided by the constant driving current I and stored in RAM 13d is different for different pairs of elements. Supposing that the individual light reception value is Wn (n=1, 2, ...), if the light emitting elements are light emitting diodes and the light reception elements are phototransistors or photodiodes, Wn is approximately proportional to the driving current I and can be expressed as:

$$Wn = Kn \cdot I$$

where Kn (n=1, 2, ...) is a proportional factor which is different for each pair of light emitting devices 1 and photodetectors 2. Since the individual light reception value Wn is controlled to be a constant value when the light is not interrupted by an object, the individual driving current In (individual driving amount for light emission) for driving the respective light emitting devices is defined as In=I·W/Wn. In this way, the light reception value of the respective photodetectors is defined as Kn·(I·W/Wn)=Wn·/Wn=W and may be controlled as a constant value W. The individual driving current In may be computed by the computing control circuit 13a based on the individual light reception value Wn stored in RAM 13d. It is also possible for the individual driving current In to be computed every time the individual light reception value Wn is obtained and stored in RAM 13d. Or the individual driving current In may be computed when the current is controlled with the status of W/Wn stored in RAM 13d.

In this way the signals enabling the individual driving current In to be computed and stored in the manner as above explained to be output every time the respective light emitting devices are scanned may be output to the constant current circuit 17 by way of the digital/analog converter 13c. Depending on the current output from the constant current circuit 17, the respective light emitting devices 1 are driven for light emission by the light emission driving current. When the light is not interrupted by an object, the light reception value by the respective photodetectors will be equal to W. Furthermore the light reception value W thus input is compared by the microprocessor 13 with the comparison level serving as a reference. When the compared value is smaller than the comparison level, it is decided that an object is present. When the compared value is larger than the comparison level, it is decided that no object is present.

The timing or means by which the respective individual light reception value Wn is measured and the control data is computed based on the light reception value is stored in RAM 13d may be the time of turning ON the power source of the present apparatus (in this case, if the power source is turned off, the content of memory will be erased), or the time of storing the control data in the RAM with a back-up at any optional timing (in this case, even if the power source is turned off, the content of the memory remains unchanged), or storing them in ROM 18 in any suitable manner. In this case, since the content of the memory will not be erased when the power source is turned off, the control data may be retrieved and used for drive control of the light emitting devices for light emission continuously.

While the present invention has been described in connection with a preferred embodiment thereof, it will be understood that it is not intended to limit the invention to that embodiment only. On the contrary, it is intended to cover all alternatives, modifications and equivalents as may be reasonably included within the spirit and scope of the invention as defined by the appended claims.

What is claimed is:

1. An optical detection apparatus having plural pairs of light emitting devices and having photodetectors arranged with each pair of the light emitting devices, the photodetectors being spaced apart from each other and adapted to detect an object which interrupts light emitted from the light emitting devices and detected by the photodetectors, the optical detection apparatus comprising:

a constant current circuit for supplying a driving current to the light emitting devices for light emission;

a measuring means for measuring an individual light reception value (Wn) received by the photodetectors in one scanning of the light emitting devices when a driving amount for light emission of the light emitting devices is controlled to be a constant value (I) and the light is not interrupted by an object;

a computing means for computing an individual driving amount for light emission for each light emitting device by equation $In = I \cdot W/n$ in accordance with the individual light reception value Wn measured by the measuring means so that the individual light reception value received by the photodetectors may be kept at a constant value (W);

a memory means for storing the individual driving amount for light emission for each of the light emitting devices as computed by the computing means; and a control means for driving the constant current circuit in accordance with the individual driving amount for light emission computed as above, whereby the light emitting devices are driven for light emission in accordance with the driving current corresponding to the individual driving amount (In).

2. The optical detection apparatus as claimed in claim 1 wherein the individual driving amount for light emission which is measured and computed is stored in the memory means at a time when the power source of the present apparatus is turned on.

3. The optical detection apparatus as claimed in claim 1 wherein the individual driving amount for light emission is computed at any optical timing and stored in RAM with a back-up.

4. The optical detection apparatus as claimed in claim 1 wherein the individual driving amount for light emission is stored in ROM.

5. The optical detection apparatus as claimed in claim 1 wherein the individual driving amount for light emission is computed every time when an individual light reception value is obtained and stored in the memory means.

6. The optical detection apparatus as claimed in claim 1 wherein the individual driving amount for light emission is stored in the memory means as the ratio W/Wn between the individual light reception value Wn and the constant value W when the light is not interrupted by an object.

* * * * *

UNITED STATES PATENT AND TRADEMARK OFFICE
CERTIFICATE OF CORRECTION

PATENT NO. : 5,051,574
DATED : September 24, 1991
INVENTOR(S) : Yoshida et al.

It is certified that error appears in the above-identified patent and that said Letters Patent is hereby corrected as shown below:

Claim 1:

column 5, line 6, change "In=I·W/n" to ---In = I·W/√n---.

Signed and Sealed this

Eighth Day of June, 1993

Attest:

MICHAEL K. KIRK

Attesting Officer

Acting Commissioner of Patents and Trademarks